United States Patent
Prakuzhy et al.

(10) Patent No.: US 12,412,800 B2
(45) Date of Patent: Sep. 9, 2025

(54) INTEGRATED CIRCUIT PACKAGE HAVING ENHANCED THERMAL DISSIPATION STRUCTURE

(71) Applicant: TEXAS INSTRUMENTS INCORPORATED, Dallas, TX (US)

(72) Inventors: Manu Joseph Prakuzhy, Allen, TX (US); Siva Prakash Gurrum, Allen, TX (US); Blake Barrett Travis, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/239,776

(22) Filed: Apr. 26, 2021

(65) Prior Publication Data

US 2022/0344232 A1    Oct. 27, 2022

(51) Int. Cl.
*H01L 23/36* (2006.01)
*H01L 21/56* (2006.01)
*H01L 23/31* (2006.01)
*H01L 23/538* (2006.01)

(52) U.S. Cl.
CPC .............. *H01L 23/36* (2013.01); *H01L 21/56* (2013.01); *H01L 23/31* (2013.01); *H01L 23/5386* (2013.01)

(58) Field of Classification Search
CPC ...... H01L 23/36; H01L 21/56; H01L 23/4334
USPC .......................................................... 257/713
See application file for complete search history.

(56) References Cited

U.S. PATENT DOCUMENTS

| | | | |
|---|---|---|---|
| 10,854,531 B2 * | 12/2020 | Chew ..................... | H01L 24/97 |
| 2004/0212080 A1 * | 10/2004 | Chen .................. | H01L 23/4334 |
| | | | 257/713 |
| 2009/0294947 A1 * | 12/2009 | Tain .................... | H01L 25/0657 |
| | | | 257/713 |
| 2012/0045871 A1 * | 2/2012 | Lee ...................... | H01L 23/3128 |
| | | | 257/E21.502 |
| 2012/0133039 A1 * | 5/2012 | Pruvost .................. | H01L 23/36 |
| | | | 257/706 |
| 2012/0298728 A1 * | 11/2012 | Sekimoto ............. | H05K 3/4617 |
| | | | 228/175 |
| 2013/0161803 A1 * | 6/2013 | Briere ............... | H01L 23/49568 |
| | | | 257/675 |
| 2016/0172268 A1 * | 6/2016 | Katkar ................ | H01L 25/0652 |
| | | | 257/774 |

* cited by examiner

*Primary Examiner* — Quoc D Hoang
(74) *Attorney, Agent, or Firm* — Yudong Kim; Frank D. Cimino

(57) ABSTRACT

An integrated circuit and method of making an integrated circuit is provided. The integrated circuit includes an electrically conductive connector and a die that has an active side and a non-active side. The active side of the die is connected to the electrically conductive connector via interconnects. A molding compound encapsulates the die and portions of the electrically conductive connector. A thermally conductive contact extends from a thermal hotspot on the die to an entry surface of the molding compound.

19 Claims, 5 Drawing Sheets

INTEGRATED CIRCUIT PACKAGE HAVING ENHANCED THERMAL DISSIPATION STRUCTURE

TECHNICAL FIELD

The present disclosure relates generally to integrated circuit packages, and more specifically to integrated circuit packages having enhanced thermal dissipation structures.

BACKGROUND

Thermal management is an important aspect in the design and manufacture of electronic devices that include integrated circuits (IC's). If thermal management in an electronic device and, more specifically, in an integrated circuit (IC) is not properly managed, then the performance of the electronic device encompassing the integrated circuit is compromised. Specifically, excessive heat loss translates into lost power in the electronic device. Thus, the computing processes of the electronic device decrease in speed thereby slowing the functions of the electronic device. In addition, the electronic device can shut down due to an abundance of heat or if the electronic device is unable to control a thermal runaway. More specifically, some of the electrical energy associated with electric current in the IC is dissipated in the IC as heat. If the IC gets too hot as a result, the circuits within the IC become unreliable or are permanently destroyed. As a result, performance of the electronic device is impacted since the thermal requirements of the electronic device are exceeded. Therefore, keeping IC's cool during operation is vitally important.

SUMMARY

In described examples, an integrated circuit includes an electrically conductive connector and a die having an active side and a non-active side, where the active side of the die is connected to the electrically conductive connector. A molding compound encapsulates the die and portions of the electrically conductive connector. A thermally conductive contact extends from a thermal hotspot on the die to an entry surface of the molding compound.

In another described example, a method of fabricating integrated circuits includes providing a die having an active side and a non-active side and attaching the active side of the die to an electrically conductive connector. A molding compound is formed over the die and portions of the electrically conductive connector. A via is formed through the molding compound and extends from an entry surface of the molding compound to a thermal hotspot on the die. A thermally conductive material is deposited in the via to form a thermally conductive contact from the thermal hotspot on the die to the entry surface of the molding compound.

In still another described example, an electronic device includes an electrically conductive connector and a die that includes an active side and a non-active side. The active side of the die is connected to the electrically conductive connector via interconnects. A molding compound encapsulates the die, the interconnects and portions of the electrically conductive connector. A thermally conductive contact extends from a thermal hotspot on the die to an entry surface of the molding compound.

DETAILED DESCRIPTION

Integrated circuits are at the heart of most modern electronic devices, including mobile devices, computers, communication systems, etc. The widespread use of electronic devices has posed new and interesting problems in heat dissipation. Thus, as previously mentioned, thermal management is an important aspect in the design and manufacture of integrated circuits. While the size of a die (e.g., silicon die) of an integrated circuit (IC) continues to decrease in size and the operating speed and power density continues to increase, an efficient thermal management solution for integrated circuit packages (e.g., flip-chip, wire-bond, dead-bug, etc.) is critical. Specifically, due to the significant reduction in die size (e.g., 50-60%), higher current and voltage give way to higher power density and hotspots on the die, thus requiring an improved solution for thermal management, i.e., improved ways to dissipate heat and power efficiency.

Figure 1:
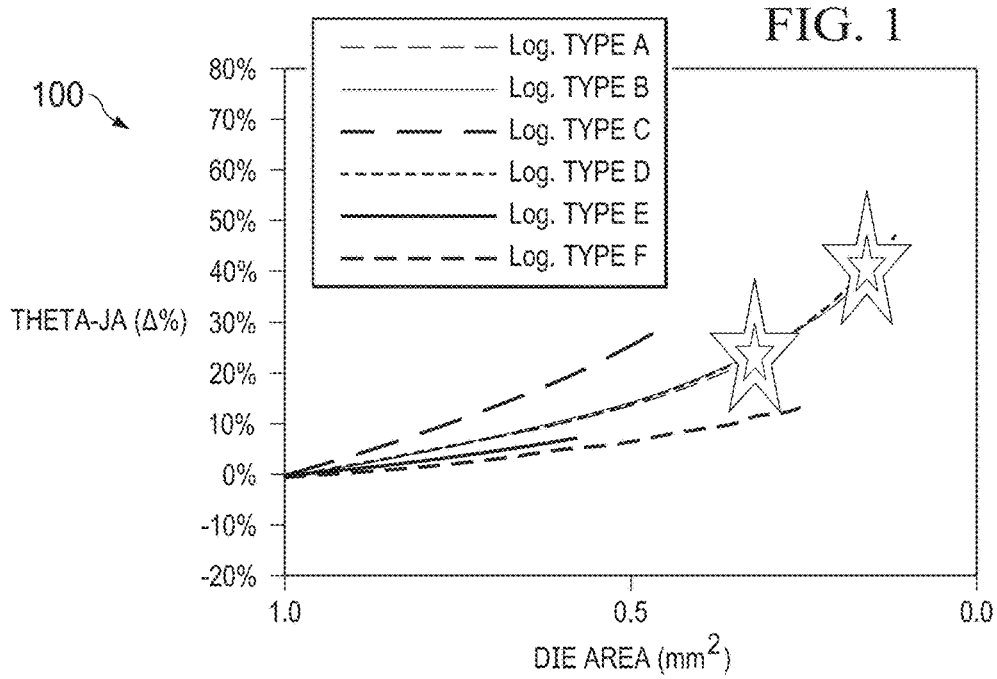
FIG. 1 is an example graph depicting a change in junction temperature of a die versus the die area in square millimeters.

This phenomena is illustrated in the graph 100 in FIG. 1. The graph 100 illustrates how thermal resistance θ-JA between die junction and ambient air, which is a key thermal metric in the industry, increases as the size of the die area is reduced. An average trend of devices in six different package types (TYPE A-F) listed in the legend are illustrated on the graph 100. As illustrated, the change is not a linear change, but is rather an exponential change. The graph 100 illustrates that a greater than 60% reduction in die area (mm$^2$) results in an increase in the die junction temperature θ-JA of approximately 10-50% depending on the package type.

In order to combat against the rise in temperature, some heat dissipation methods may include mounting the die to a surface of a metal pad. The opposite surface of the metal pad is then exposed so that the metal pad interfaces directly with either a printed circuit (PCB) so that heat is dissipated through the PCB or with a heat spreader. Another method includes exposing a backside of the die in the IC package such that the die interfaces with the PCB or the heat spreader. These methods however, require larger IC packages, which are costly, and thus, prohibit the reduction of desired smaller IC packages.

Disclosed herein is an innovative IC package and method of making an IC package that provides a thermally conductive contact, from one or more thermal hotspots on the die, through a molding compound to a surface of the molding compound. The thermally conductive contact can be formed by forming an opening in the molding compound by laser ablation, etching, stamping, localized drilling, ion drilling, mold tool design with protrusion to block mold compound, etc. In one example, the opening is then filled with a highly thermally conductive material (e.g., particle-filled polymer adhesive, solder, die-attach material, silver-sintered paste, thermal interface materials, etc.) such that the thermally conductive material is flush with the surface of the molding compound. In another example, the opening is filled with the highly thermally conductive material such that the thermally conductive material is not flush with the surface of the molding compound. A heat sink/spreader, printed circuit board (PCB), etc. can then be connected to the thermal conductive material to remove heat from the IC. The innovative IC package provides a "smart cooling" approach since the thermal hotspots on the die can be specifically targeted to obtain a thermally conductive, low heat resistive path in the form of a thermally conductive contact to dissipate heat to a heat sink/spreader or PCB.

Thermal models have indicated that the junction temperature θ-JA is reduced with the implementation of the thermally conductive contact as disclosed herein. For example, there is an approximate 44% reduction in the thermal resistance θ-JA of a dead-bug package that includes the thermally conductive contact as opposed to a standard dead-bug package. Similarly, there is an approximate 18% reduction in the thermal resistance θ-JA of a flip-chip package that includes the thermally conductive contact as opposed to a standard flip-chip package.

Figure 2A:
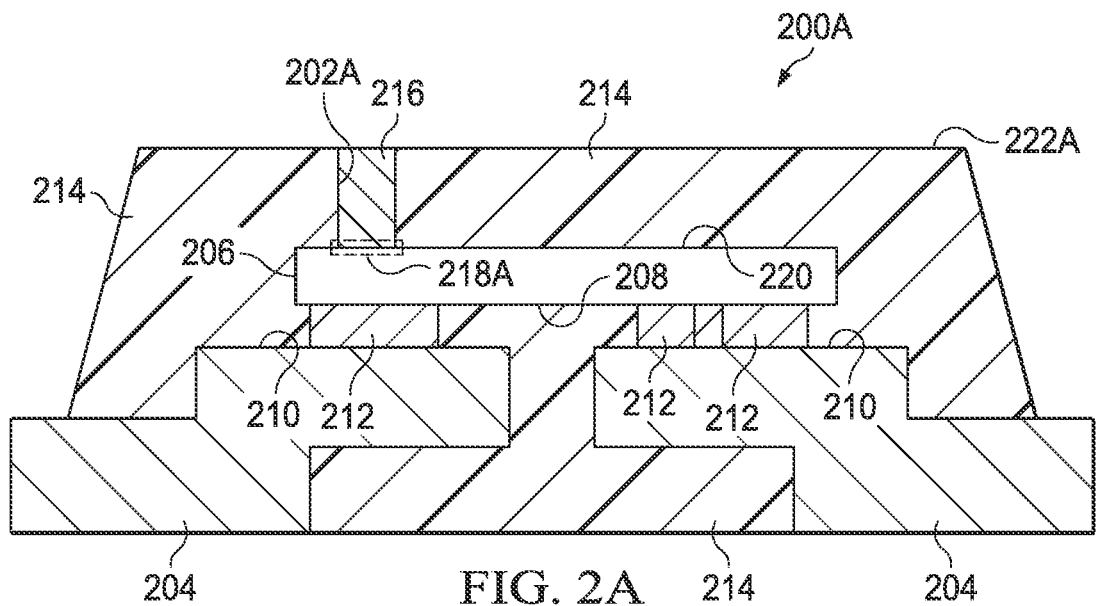
FIGS. 2A and 2B are a cross-section views of example integrated circuit packages that include a thermally conductive contact.
Figure 2B:
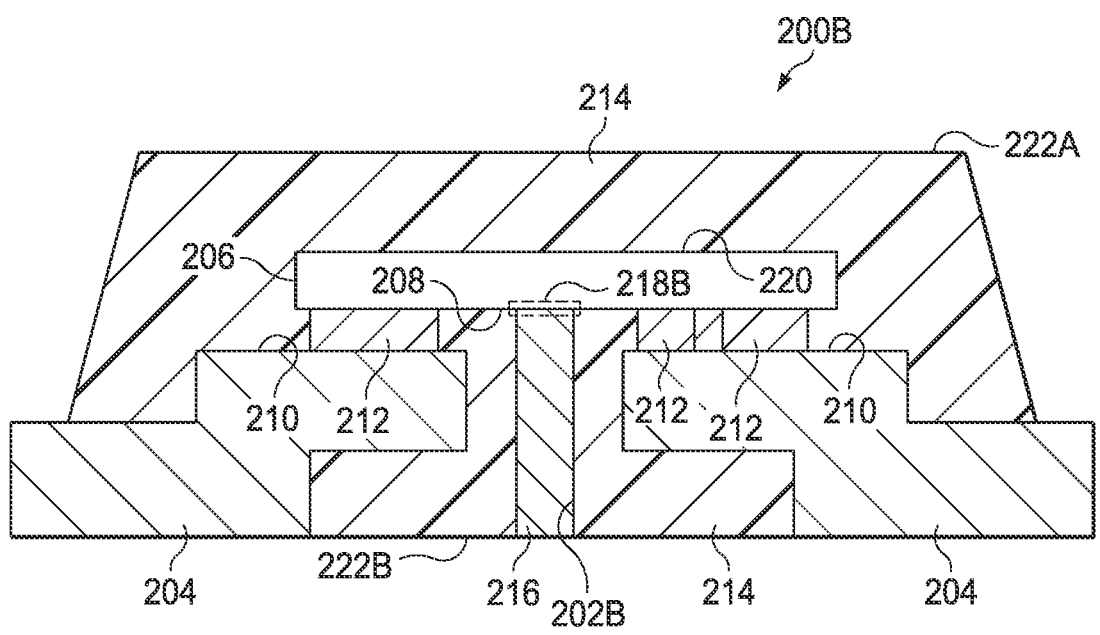

FIGS. 2A and 2B are cross-section views of example integrated circuit (IC) packages 200A, 200B that include a thermally conductive contact 202A, 202B in accordance with various examples. The IC package 200A, 200B includes an electrically conductive connector (e.g., leadframe, pins, contact pads, wires, etc.) 204 and a die (e.g., silicon) 206. An active side 208 of the die 206 is attached to a first surface 210 of the electrically conductive connector 204 via interconnects (e.g., solder, copper pillars, etc.) 212. A portion or all, including the first surface 210 of the electrically conductive connector 204, the die 206, and the interconnects 212 are covered or encapsulated with a molding compound 214. The thermally conductive contact 202A, 202B formed in the molding compound 214 is made from a highly thermally conductive material (e.g., particle-filled polymer adhesive, solder, die-attach material, silver-sintered paste, thermal interface materials, etc.) 216.

As illustrated in FIG. 2A, the thermally conductive contact 202A extends from a thermal hotspot 218A on a non-active side 220 of the die 206 to an entry (first) surface 222A of the molding compound 214 such that the thermally conductive contact 202A is flush with the entry surface 222A of the molding compound 214. In another example, the thermally conductive contact 202A extends from the thermal hotspot 218A on the non-active side 220 of the die 206 to the entry (first) surface 222A of the molding compound 214 such that the thermally conductive contact 202A is not flush with the entry surface 222A of the molding compound 214. Alternatively, as illustrated in FIG. 2B, the thermally conductive contact 202B can extend from a thermal hotspot 218B on the active side 208 of the die 206 to an entry (second) surface 222B of the molding compound 214 such that the thermally conductive contact 202B is flush with the entry surface 222B of the molding compound 214. In another example, the thermally conductive contact 202B extends from the thermal hotspot 218B on the active side 208 of the die 206 to the entry (second) surface 222B of the molding compound 214 such that the thermally conductive contact 202B is not flush with the entry surface 222B of the molding compound 214. The entry surface 222A, 222B of the molding compound 214 is defined as the surface of the molding compound 214 where a via is formed to form the thermally conductive contact 202A, 202B to either the active side 208 or the non-active side 220 of the die 206. As described below, based on IC package type and size there may be one thermally conductive contact 202A, 202B or multiple thermally conductive contacts 202A, 202B.

Figure 3:
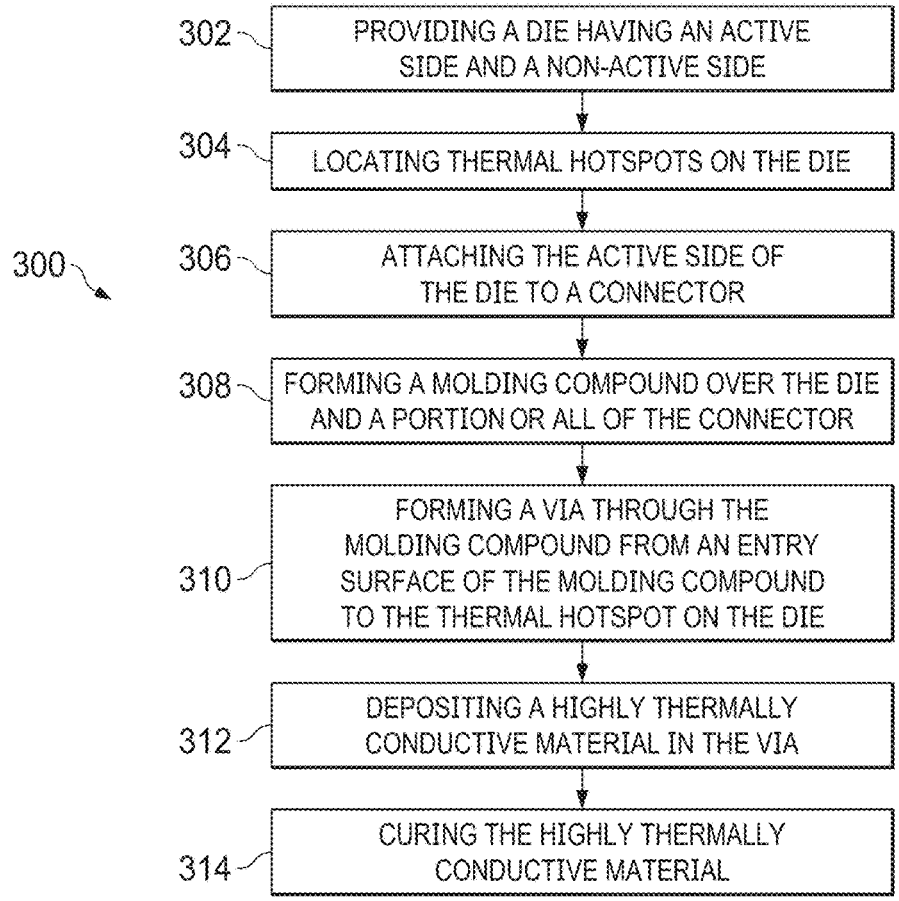
FIG. 3 is a flow diagram for a method of fabricating the integrated circuit package of FIG. 2A.

FIG. 3 illustrates a flow diagram 300 and FIGS. 4-7 illustrate the process for fabricating the IC package 200A in accordance with various examples. Though depicted sequentially as a matter of convenience, at least some of the actions shown can be performed in a different order and/or performed in parallel. Alternatively, some implementations may perform only some of the actions shown. Still further, although the example illustrated in FIGS. 4-7 is an example method illustrating the example configuration of FIG. 2A, other methods and configurations are possible.

Figure 4:
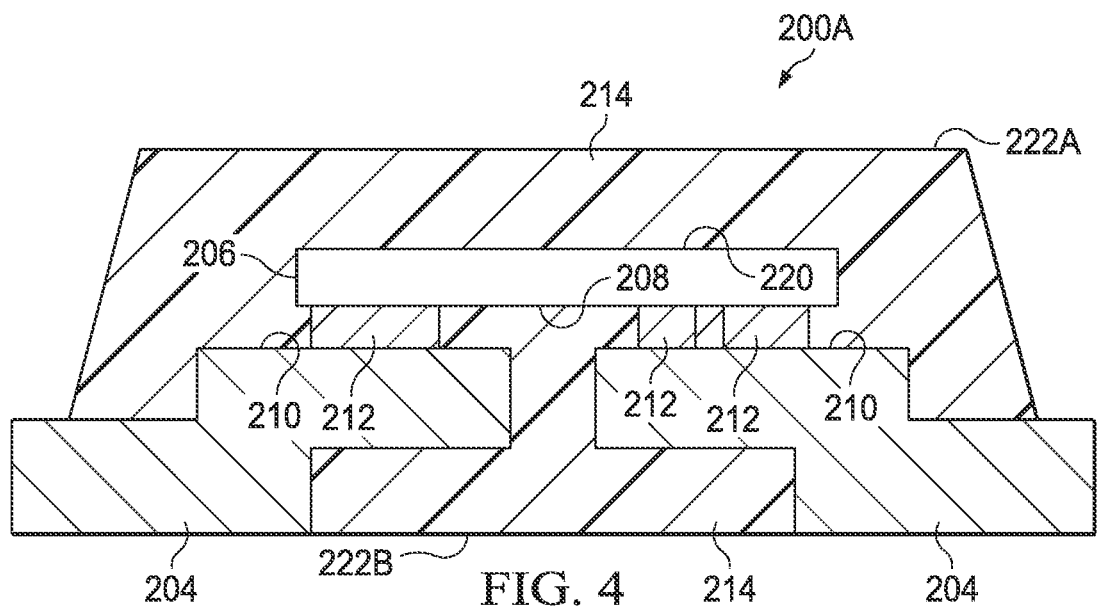
FIGS. 4-7 depict a process sequence of fabricating the integrated circuit package of FIG. 2A.
Figure 5:
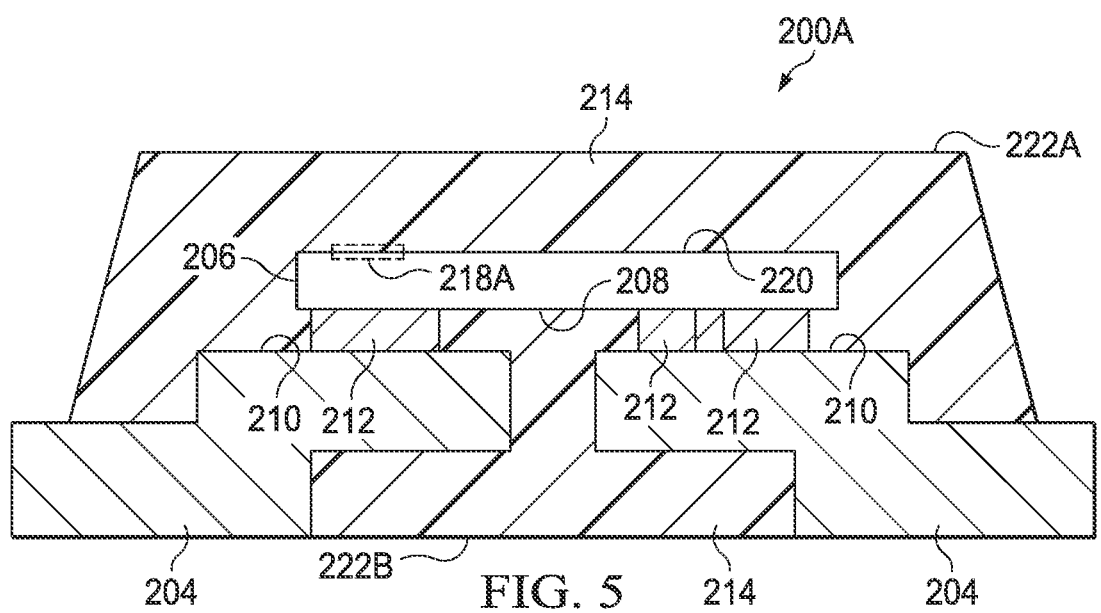

As illustrated in FIG. 4, at 302 a die is provided. For example, the structure in FIG. 4 shows a die 206 that includes an active side 208 and a non-active side 220. At 304, one or more thermal hotspots 218A are located on the die 206. The location of the thermal hot spot(s) can be determined using calculations, simulations or actual temperature detecting prior to the die 206 being attached to the electrically conductive connector 204, being covered by molding compound 214. Alternatively, the hot spots can be determined after the die 206 is attached to electrically conductive connector 204 and covered by molding compound 214. For example, the structure in FIG. 5 shows the location of a thermal hotspot 218A on the die 206. The hotspots are located by circuit analysis and simulations that identify portions of the die 206 that dissipate critical power and result in high temperatures on the die. At 306, the active side of the die is connected to an electrically conductive connector. For example, the structure in FIG. 4 shows the active side 208 of the die 206 connected to a first surface 210 of the electrically conductive connector 204 via interconnects 212. Alternatively, the die 206 can be directly connected to the electrically conductive connector 204 without the interconnects 212. At 308, a molding compound is formed over the die, the interconnects (if included), and a portion (or alternatively all) of the electrically conductive connector and then cured. For example, the structure in FIG. 4 shows the molding compound 214 formed over the die 206, the interconnects 212, and a portion of the electrically conductive connector 204.

Figure 6:
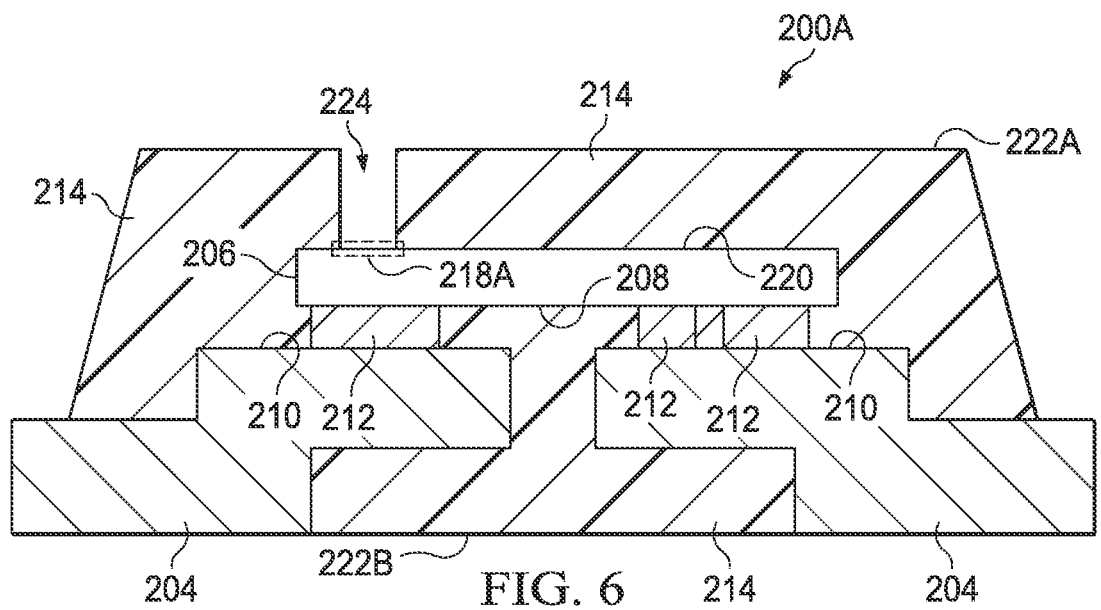

At 310, one or more vias are formed through the molding compound to the thermal hotspot on the die. For example, the structure in FIG. 6 shows a location of a via 224 formed through the molding compound 214. The via(s) 224 can be formed from an entry (first) surface 222A of the molding compound 214 through the molding compound 214 to the non-active side 220 of the die 206. Alternatively, the via(s) 224 can be formed from an entry (second) surface 222B of the molding compound 214 through the molding compound 214 to the active side 208 of the die 206, see FIG. 2B. The via(s) 224 is/are formed such that the via(s) 224 extend(s) from the entry (first) surface 222A of molding compound 214 to the one or more thermal hotspots 218A on the die 206. The via(s) 224 can be formed by laser ablation, etching, stamping, localized drilling, ion drilling, etc. and can be circular, conical (see FIG. 9), etc. Alternatively, prior to the formation of the molding compound 214, one or more hollow conduits can be adhesively attached on the die 206 at the location of the one or more thermal hotspots 218A. The molding compound 214 can then be formed around the hollow conduit(s). Determining the number, shape, and diameter of the vias 224 is based on the IC package type, the size of the die 206, and the number and size of the thermal hotspots 218A.

Figure 7:
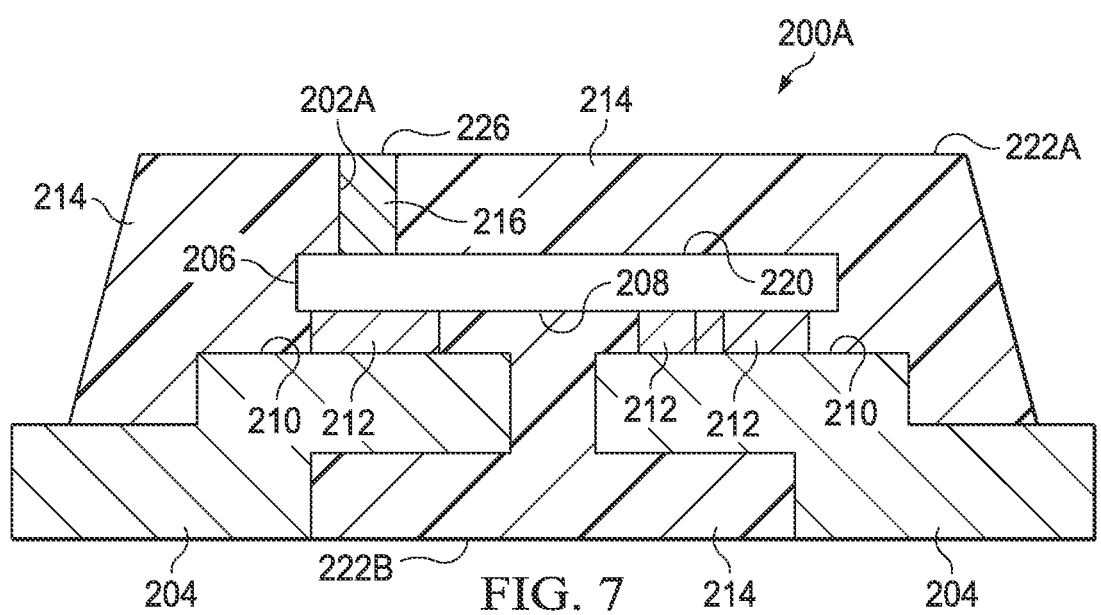

At 312, the via(s) is/are filled with a highly thermally conductive material (e.g., particle-filled polymer adhesive, solder, die-attach material, silver-sintered paste, thermal interface materials, etc.) to form one or more thermally conductive contacts. For example, the structure in FIG. 7 shows the via 224 filled with a highly thermal conductive material 216 to form the thermally conductive connector 202A. The via(s) 224 is/are filled such that an exposed surface 226 of the highly thermally conductive material 216 is flush (or alternatively not flush) with the entry (first) surface 222A of the molding compound 214. At 314, the highly thermally conductive material 216 is cured, reflowed, or processed further as needed for the material.

Figure 8:
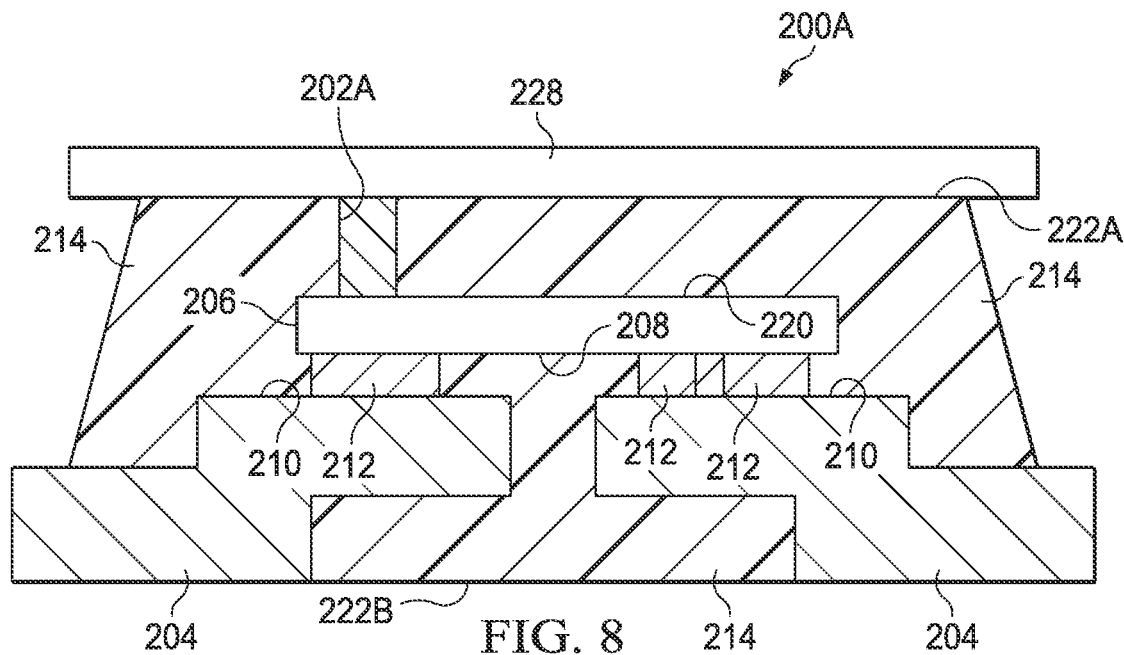
FIG. 8 is a cross-section view of the example integrated circuit package of FIG. 2A attached to a heat sink/spreader or printed circuit board.

FIG. 8 is a cross-section view of a heat sink/spreader or PCB 228 attached to the first surface 222A of the molding compound 214 of the example integrated circuit package 200A. The thermally conductive contact 202A enables a direct connection of the die 206 to the heat sink/spreader or PCB 228 to thereby efficiently remove heat from the die 206 and ultimately, from the IC package 200A and electronic device.

Figure 9:
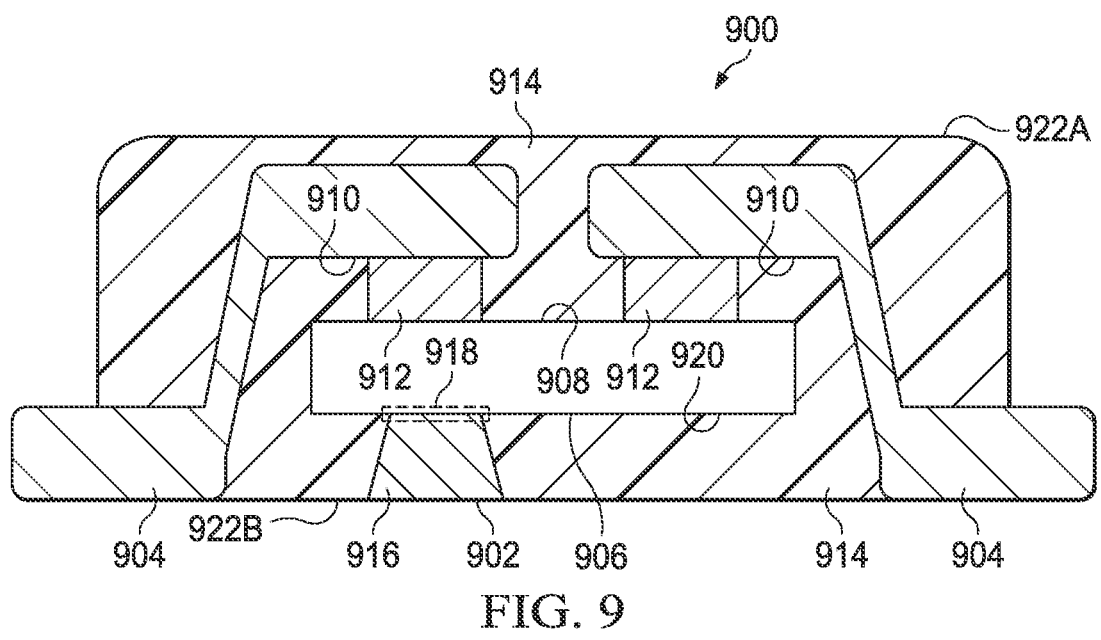
FIG. 9 is a cross-section view of another example integrated circuit package that includes a thermally conductive contact.

FIG. 9 is a cross-section view of another example integrated circuit (IC) package 900 that includes a thermally conductive contact 902 in accordance with various examples. The IC package 900 includes an electrically conductive connector (e.g., leadframe, pins, contact pads, wires, etc.) 904 and a die (e.g., silicon) 906. An active side 908 of the die 906 is attached to a first surface 910 of the electrically conductive connector 904 via interconnects (e.g., solder, copper pillars, etc.) 912. A molding compound 914 encapsulates the die 906, the interconnects 912, and a portion (or alternatively all), including the first surface 910, of the electrically conductive connector 904. The thermally conductive contact 902 is formed through the molding compound 914 from a highly thermally conductive material (e.g., particle-filled polymer adhesive, solder, die-attach material, silver-sintered paste, thermal interface materials, etc.) 916. The molding compound 914 includes a first surface 922A and a second surface 922B. As described herein, either or both of the first and second surfaces 922A, 922B can serve as an entry surface.

Specifically, in the illustrated example, the thermally conductive contact 902 extends from a thermal hotspot 918 on a non-active side 920 of the die 906 to the entry (second) surface 922B of the molding compound 914 such that the thermally conductive contact 902 is flush (or alternatively not flush) with the entry surface 922B of the molding compound 914. The entry surface 922B of the molding compound 914 is defined as the surface of the molding compound 914 where a via is formed to form the thermally conductive contact 902 to either the active side 908 or the non-active side 920 of the die 906. As described herein, based on IC package type and size there may be one thermally conductive contact 902 or multiple thermally conductive contacts 902. In addition, the thermally conductive contact(s) 902 can be formed such that the thermally conductive contact(s) 902 extend from the die 906 to either the first surface 922A and/or the second surface 922B of the molding compound 914.

Modifications are possible in the described embodiments, and other embodiments are possible, within the scope of the claims.

What is claimed is:

1. An electronic device, comprising:
    a leadframe including a lead;
    a die having an active side and a non-active side opposite the active side, the active side of the die facing the leadframe and connected to the leadframe;
    a molding compound encapsulating the die and portions of the leadframe, wherein a bottom surface of the lead is flush with a first surface of the molding compound adjacent to the active side; and
    one or more thermally conductive contacts being disposed exclusive to and respectively extending from one or more thermal hotspots of the non-active side of the die, the one or more thermally conductive contacts being in contact with the non-active side of the die, to a second surface of the molding compound opposite the first surface, wherein the second surface is adjacent to the non-active side of the die;
    wherein each of the one or more thermal hotspots comprises an area of the non-active side of the die having a higher power density than one or more other areas of the non-active side of the die.

2. The electronic device of claim 1, wherein a surface of each of the one or more thermally conductive contacts is flush with the second surface of the molding compound.

3. The electronic device of claim 1, wherein each of the one or more thermally conductive contacts is comprised of one of a metal flaked resin epoxy, a particle-filled polymer adhesive, solder, die-attach material, silver-sintered paste, or thermal interface materials.

4. The electronic device of claim 1, further comprising a conduit surrounding each of the one or more thermally conductive contacts, the conduit attached to a location of a corresponding one of the one or more thermal hotspots.

5. The electronic device of claim 1, wherein the lead comprises a first portion and a second portion, the first portion of the lead extending from the first surface of the molding compound around a lateral edge of the die, the second portion of the lead extending from the first portion and overlaying a portion of the active side of the die, wherein a bottom surface of the first portion of the lead is flush with the first surface of the molding compound adjacent to the active side, and wherein one or more interconnects are formed between the active side of the die and the second portion of the lead.

6. A method of fabricating electronic devices, the method comprising:
    providing a die having an active side and a non-active side opposite the active side;
    attaching the active side of the die to a leadframe including a lead;
    forming a molding compound encapsulating the die and portions of the leadframe, wherein a bottom surface of the lead is flush with a first surface of the molding compound adjacent to the active side;
    locating one or more thermal hotspots on the non-active side of the die, the one or more thermal hotspots respectively comprising one or more areas of the non-active side of the die having a higher power density than one or more other areas of the non-active side of the die;
    forming one or more vias through the molding compound and respectively extending from a second surface of the molding compound opposite the first surface to the one or more thermal hotspots on the non-active side of the die; and
    depositing a thermally conductive material in each of the one or more vias to form one or more thermally conductive contacts disposed exclusive to and respectively extending from the one or more thermal hotspots to the second surface of the molding compound, wherein the second surface is adjacent to the non-active side of the die.

7. The method of claim 6, wherein depositing the thermally conductive material in each of the one or more vias comprises depositing the thermally conductive material in each of the one or more vias, wherein the thermally conductive material is flush with the second surface of the molding compound.

8. The method of claim 6, wherein forming the one or more vias comprises ablating the molding compound via a laser.

9. The method of claim 6, wherein forming the one or more vias comprises etching the via in the molding compound.

10. The method of claim 6, wherein forming each of the one or more vias comprises attaching a hollow conduit at a location of a corresponding one of the one or more thermal hotspots such that the molding compound surrounds the hollow conduit.

11. The method of claim 6, further comprising determining the one or more thermal hotspots on the die prior to attaching the active side of the die to the leadframe.

12. The method of claim 6, further comprising determining the one or more thermal hotspots on the die after attaching the active side of the die to the leadframe.

13. The method of claim 6, further comprising curing the thermally conductive material in each of the one or more vias.

14. The method of claim 6, wherein the lead comprises a first portion and a second portion, the first portion of the lead extending from a first surface of the molding compound around a lateral edge of the die, the second portion of the lead extending from the first portion and overlaying a portion of the active side of the die, wherein a bottom surface of the first portion of the lead is flush with the first surface of the molding compound adjacent to the active side, and wherein one or more interconnects are formed between the active side of the die and the second portion of the lead.

15. An electronic device, comprising:
a leadframe including a lead;
a die having an active side and a non-active side opposite the active side, the active side of the die facing the leadframe and connected to the leadframe through interconnects;
a molding compound encapsulating the die, the interconnects and portions of the leadframe, wherein a bottom surface of the lead is flush with a first surface of the molding compound adjacent to the active side; and
one or more thermally conductive contacts being disposed exclusive to and respectively extending from one or more thermal hotspots of the non-active side of the die, the one or more thermally conductive contacts being in contact with the non-active side of the die, to a second surface of the molding compound opposite the first surface, wherein the second surface is adjacent to the non-active side of the die;
wherein each of the one or more thermal hotspots comprises an area of the non-active side of the die having a higher power density than one or more other areas of the non-active side of the die.

16. The electronic device of claim 15, wherein a surface of each of the one or more thermally conductive contacts facing away from the non-active side is flush with the second surface of the molding compound.

17. The electronic device of claim 15, wherein a surface of each of the one or more thermally conductive contacts facing away from the non-active side is not flush with the second surface of the molding compound.

18. The electronic device of claim 15, further comprising a conduit surrounding each of the one or more thermally conductive contacts, the conduit attached to a location of a corresponding one of the one or more thermal hotspots.

19. The electronic device of claim 15, wherein the lead comprises a first portion and a second portion, the first portion of the lead extending from the first surface of the molding compound around a lateral edge of the die, the second portion of the lead extending from the first portion and overlaying a portion of the active side of the die, wherein a bottom surface of the first portion of the lead is flush with the first surface of the molding compound adjacent to the active side, and wherein one or more interconnects are formed between the active side of the die and the second portion of the lead.

* * * * *